(12) United States Patent
Ishihara

(10) Patent No.: US 10,622,304 B2
(45) Date of Patent: Apr. 14, 2020

(54) STORAGE DEVICE INCLUDING MULTIPLE WIRING AND ELECTRODE LAYERS

(71) Applicant: TOSHIBA MEMORY CORPORATION, Tokyo (JP)

(72) Inventor: Hanae Ishihara, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,984

(22) Filed: Feb. 28, 2018

(65) Prior Publication Data

US 2018/0277477 A1 Sep. 27, 2018

(30) Foreign Application Priority Data

Mar. 22, 2017 (JP) .................. 2017-056405

(51) Int. Cl.
- *H01L 23/528* (2006.01)
- *H01L 27/11582* (2017.01)
- *H01L 27/11575* (2017.01)
- *H01L 27/11573* (2017.01)

(52) U.S. Cl.
CPC ...... *H01L 23/528* (2013.01); *H01L 27/11573* (2013.01); *H01L 27/11575* (2013.01); *H01L 27/11582* (2013.01)

(58) Field of Classification Search
CPC .......... H01L 27/11551–11556; H01L 27/11578–11582; H01L 27/11526–11548; H01L 27/11573–11575; H01L 23/528; H01L 27/11524; H01L 27/11529
See application file for complete search history.

(56) References Cited

U.S. PATENT DOCUMENTS

| | | | |
|---|---|---|---|
| 7,936,004 B2 | 5/2011 | Kito et al. | |
| 2011/0147937 A1* | 6/2011 | Kubota | H01L 21/76801 257/751 |
| 2012/0294083 A1* | 11/2012 | Banna | G11C 16/0441 365/185.08 |
| 2015/0138862 A1* | 5/2015 | Park | H01L 27/11573 365/51 |

FOREIGN PATENT DOCUMENTS

JP 2007-266143 A 10/2007

* cited by examiner

*Primary Examiner* — Nelson Garces
(74) *Attorney, Agent, or Firm* — Kim & Stewart LLP

(57) ABSTRACT

A storage device includes a first wiring layer, a second wiring layer spaced from the first wiring layer in a first direction, and a plurality of electrode layers stacked in the first direction between the first wiring layer and the second wiring layer. A semiconductor pillar penetrates the plurality of electrode layers in the first direction. The plurality of electrode layers includes a first electrode layer connected to a first wire in the first wiring layer and a second electrode layer connected to a second wire in the second wiring layer.

14 Claims, 7 Drawing Sheets

STORAGE DEVICE INCLUDING MULTIPLE WIRING AND ELECTRODE LAYERS

This application is based upon and claims the benefit of priority from Japanese Patent Application No. 2017-056405, filed Mar. 22, 2017, the entire contents of which are incorporated herein by reference.

FIELD

An embodiment described herein relates generally to a storage device.

BACKGROUND

A storage device which includes memory cells three-dimensionally arranged has been developed. For example, a NAND type storage device includes a plurality of stacked electrode layers with a semiconductor channel penetrating the stacked electrode layer. Memory cells are formed where the semiconductor channel intersect an electrode layer. The electrode layers function as a control gate of the memory cells. In a storage device having such a structure, it is necessary to lead out the electrode layers individually, that is provide connecting portions to electrically connect each electrode layer to a drive circuit or the like. For this reason, typically a structure is adopted in which ends of the plurality of electrode layers form in a staircase or stair-stepped pattern so that a vertical contact plug can be connected to each of the end portions. However, as the number of stacked electrode layers increases, the device layout area required for forming the end portions in a staircase pattern on the chip surface increases, which reduces then number of memory cells that can be formed in a device of a given size and/or hinders miniaturization of storage devices.

DETAILED DESCRIPTION

Figure 1A:
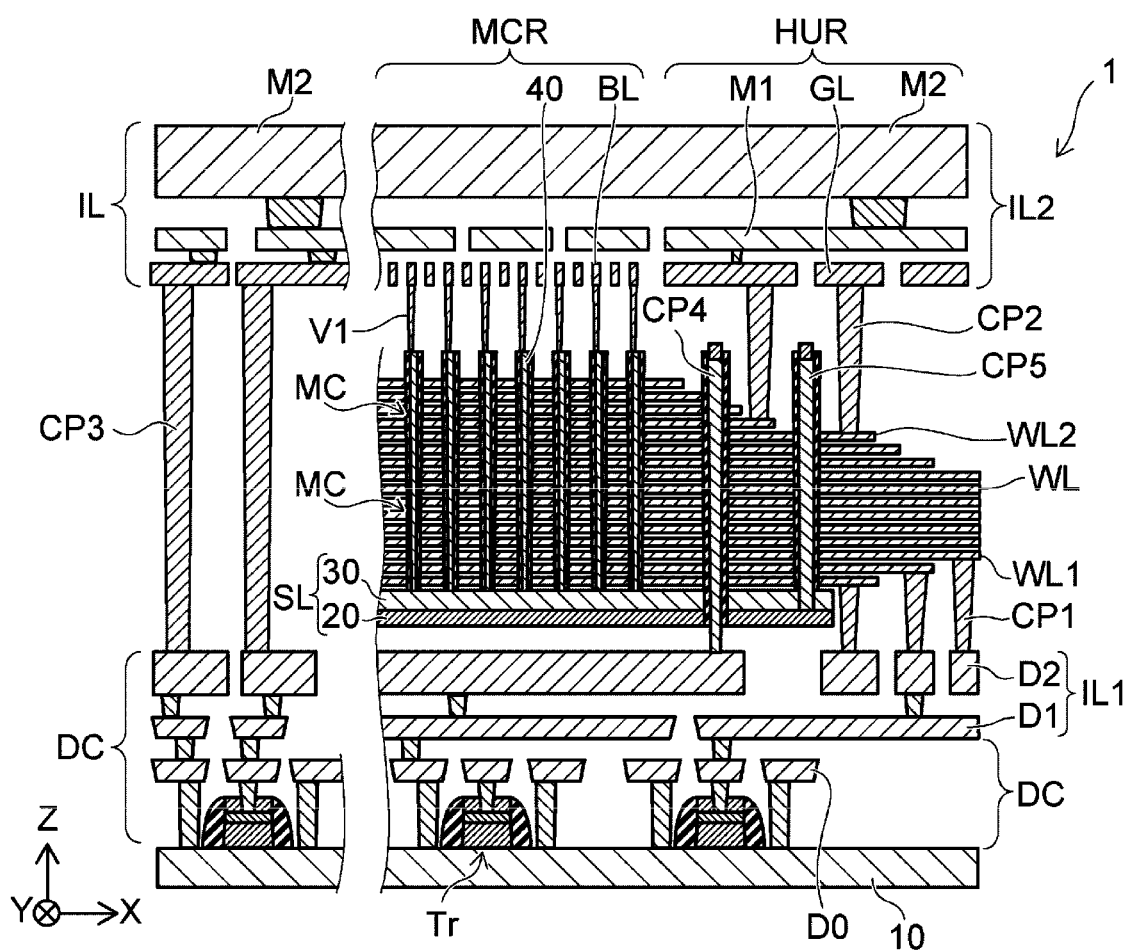
FIGS. 1A and 1B are schematic cross-sectional views showing a storage device according to an embodiment.

Embodiments provide a storage device in which a lead-out region for stacked electrode layers can be reduced in area.

In general, according to one embodiment, a storage device, comprises a first wiring layer, a second wiring layer spaced from the first wiring layer in a first direction, and a plurality of electrode layers stacked in the first direction between the first wiring layer and the second wiring layer. A semiconductor pillar penetrates the plurality of electrode layers in the first direction. The plurality of electrode layers includes a first electrode layer that is connected to a first wire in the first wiring layer and a second electrode layer that is connected to a second wire in the second wiring layer.

An embodiment will be described below with reference to the accompanying drawings. The same reference numerals are assigned to the same aspects in the drawings and detailed description of repeated aspects may be omitted as appropriate, and different aspects will be described. The drawings are schematic or conceptual, and relationship between the thickness and width of each portion, and the size ratio between portions do not always represent the actual dimension. Further, even if the same portions are shown, respective dimensions and ratios may be differently shown in some drawings.

Further, the embodiments will be described using the X-axis, the Y-axis and the Z-axis shown in each drawing. The X-axis, Y-axis and Z-axis are mutually orthogonal, and correspond to the X direction, Y direction and Z direction, respectively. Furthermore, for convenience, one direction along the Z direction may be referred to as an upward direction, and the opposite direction may be referred to as a downward direction.

Figure 1B:
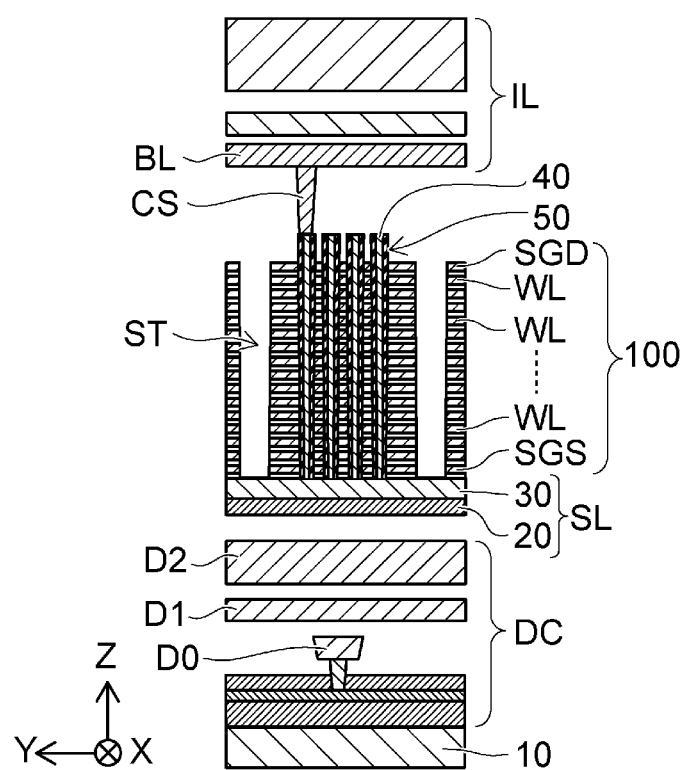

FIGS. 1A and 1B are schematic cross-sectional views showing a storage device 1 according to an embodiment. The storage device 1 is a NAND type storage device, and includes memory cells three-dimensionally arranged. FIG. 1A is a schematic diagram showing a cross section parallel to the extending direction of word lines WL, and FIG. 1B is a schematic diagram showing a cross section orthogonal to the word lines WL. In FIGS. 1A and 1B, for the sake of convenience, an insulating film provided between components is omitted.

As shown in FIG. 1A, the storage device 1 includes a circuit DC provided on a substrate 10, a wiring layer IL1 provided over the circuit DC, a source line SL, a plurality of word lines WL and a wiring layer IL2. The source line SL is provided above the wiring layer IL1, and the word lines WL are stacked on the source line SL. The wiring layer IL2 is provided above the word lines WL.

The circuit DC includes, for example, a plurality of transistors Tr and a wire D0. The wiring layer IL1 includes, for example, a wire D1 and a wire D2. The wire D0 is electrically connected to the transistor Tr, and the wire D1 is connected to the wire D0 via a connection conductor (hereinafter referred to as a contact plug). Further, the wire D2 is connected to the wire D1 via another contact plug. Here, the contact plug is an example of "the connection conductor", and the "connection conductor" also includes, for example, a conductor embedded in a contact hole provided within an insulating film.

The source line SL includes a conductive layer 20 and a semiconductor layer 30. The conductive layer 20 is a low resistance material containing a metal element such as tungsten (W). The conductive layer 20 is, for example, a plate-shaped metal layer spreading in the X direction and the Y direction. The semiconductor layer 30 is provided on the conductive layer 20. The semiconductor layer 30 is, for example, a polysilicon layer.

The word lines WL are stacked on the source line SL with an interlayer insulating film, not shown, interposed therebetween. The word lines WL extend in the X direction, respectively. The word lines WL are, for example, metal layers containing tungsten or the like. Further, the wiring layer IL2 includes, for example, a bit line BL, a gate wiring GL, and wires M1 and M2.

The storage device 1 includes a memory cell region MCR and a lead-out region HUR. Three-dimensionally arranged memory cells MC are provided in the memory cell region MCR, and electrical connection to each of the plurality of word lines is established in the lead-out region HUR.

The storage device 1 further includes a columnar semiconductor layer (hereinafter referred to as a semiconductor pillar 40) provided in the memory cell region MCR. The semiconductor pillar 40 penetrates the word lines WL and extends in the stacking direction (Z direction). The semiconductor pillar 40 includes, for example, silicon, and is connected to the semiconductor layer 30 of the source line SL at the lower end thereof. Further, the upper end of the semiconductor pillar 40 is connected to the bit line BL via the contact plug V1. A memory cell MC is located at a portion where the semiconductor pillar 40 intersects with each of the word lines WL. The semiconductor pillar 40 functions as a channel of the memory cells MC.

For example, the end portions of the word lines WL are provided in a staircase pattern in the lead-out region HUR. For example, the word lines WL includes word lines WL1 connected to the wire D2 of the wiring layer IL1 and word lines WL2 connected to the gate wiring GL of the wiring layer IL2. Hereinafter, in some cases, respective word lines may be collectively referred to as word lines WL, and in other cases, they may be individually described as the word lines WL1 and the word lines WL2. The other components may be similarly described.

For example, an end portion of each word line WL1 is connected to a contact plug CP1, and the contact plug CP1 is connected to the wire D2. That is, each word line WL1 is electrically connected to the circuit DC via the wires D2, D1 and D0.

For example, an end portion of each word line WL2 is connected to a contact plug CP2, and the contact plug CP2 is connected to the gate wiring GL. The gate wiring GL is electrically connected to the circuit DC via the wires M1 and M2 located thereon and the contact plug CP 3, for example.

As shown in FIG. 1A, the storage device 1 may further include contact plugs CP4 and CP5 penetrating the word lines WL and extending in the Z direction. For example, the contact plug CP4 further penetrates the source line SL, and electrically connect the wire D2 of the wiring layer IL1 and any of the wires of the wiring layer IL2. Further, for example, the contact plug CP5 electrically connects the source line SL and any of the wires of the wiring layer IL2. The contact plug CP5 is connected to the conductive layer 20 of the source line SL, for example.

As shown in FIG. 1B, a stacked body 100 including word lines WL is provided on the source line SL. The stacked body 100 further includes selection gates SGS and SGD. The selection gate SGS is located between the source line SL and a word line WL. The selection gate SGD is located between a word line WL and the wiring layer IL2. The stacked body 100 is divided into a plurality of portions by slits ST. Each slit ST extends in the X direction and defines the shape of the word lines WL, and the selection gates SGS and SGD. For example, an insulating layer, not shown, is provided in each slit ST.

The semiconductor pillar 40 penetrates the selection gate SGS, the word lines WL and the selection gate SGD, and extends in the Z direction. The storage device 1 further includes an insulating film 50 located between each of the selection gate SGS, the word lines WL and the selection gate SGD, and the semiconductor pillar 40. The insulating film 50 surrounds the side surface of the semiconductor pillar 40 and extends in the Z direction.

For example, the insulating film 50 has a structure in which a plurality of insulating films are stacked in a direction from the semiconductor pillar 40 to the word lines WL, and functions as a charge retaining layer in a portion located between the semiconductor pillar 40 and each word line WL. In addition, a selection transistor is provided in a portion where the semiconductor pillar 40 intersects the selection gates SGS and SGD.

As described above, in the storage device 1, the end portions of the word lines WL are provided in a staircase pattern in the lead-out region HUR such that the end portions face upward and downward respectively, and they are connected to the wire D2 of the wiring layer IL1 and the gate wiring GL of the wiring layer IL2, respectively. As a result, the area of the lead-out region HUR can be reduced as compared with the case of providing the stairs in which all of the end portions face upward or downward. In addition, as the area of the lead-out region HUR is reduced, the wires of the wiring layer IL2 are reduced, and the wiring resistance becomes smaller than that of the word lines WL2 connected to the circuit DC. Furthermore, the wiring resistance of the word lines WL1 connected to the circuit DC via the wiring layer IL1 is smaller than that of the word lines WL2 connected to the circuit DC via the wiring layer IL2. Therefore, by reducing the wiring resistance between the word lines WL and the circuit DC, it is possible to improve the response speed of the word lines WL.

Figure 2:
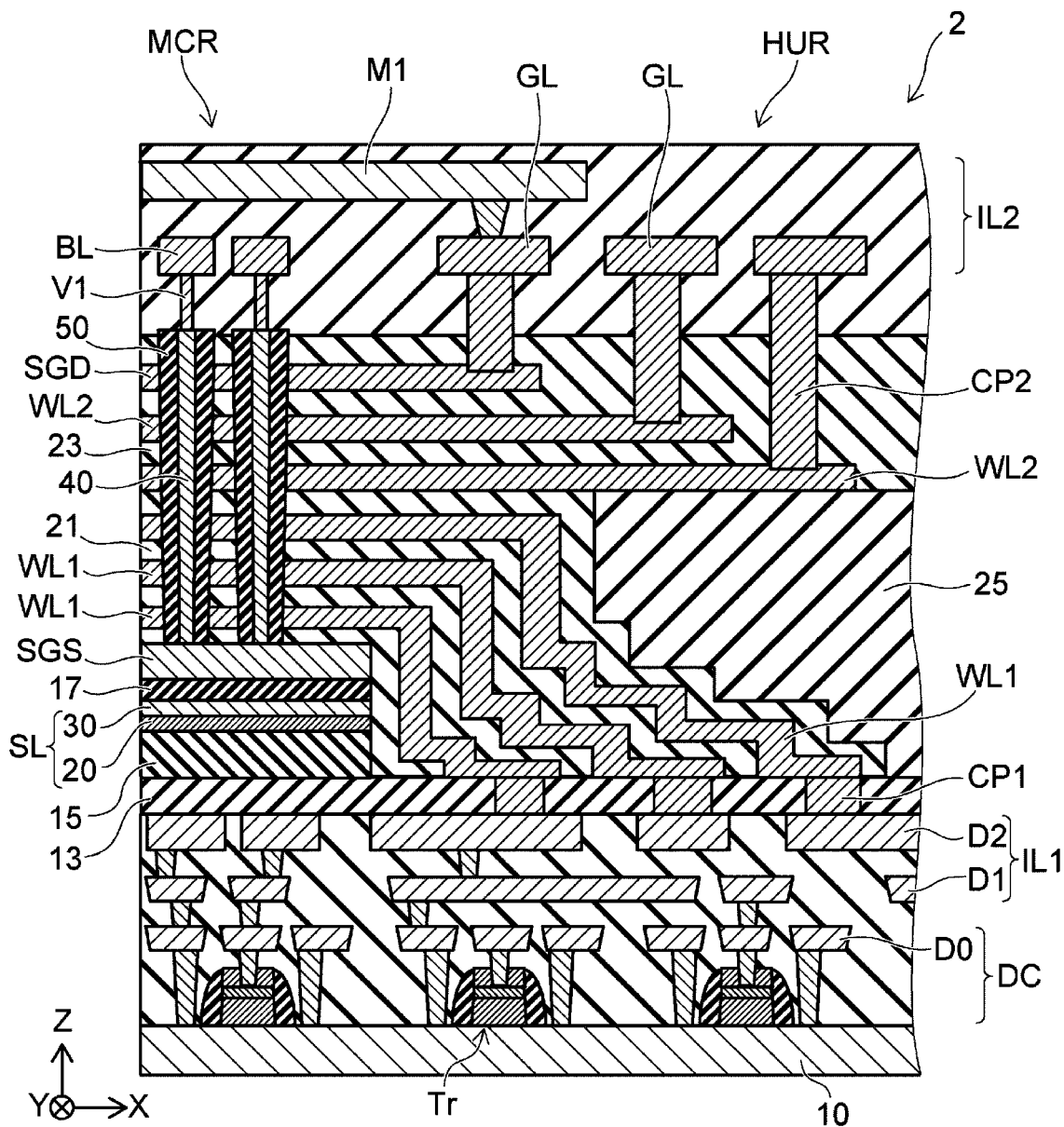
FIG. 2 is a schematic cross-sectional view showing another storage device according to the embodiment.

FIG. 2 is a schematic cross-sectional view showing another storage device 2 according to the embodiment. In the storage device 2, an interlayer insulating film 13 is provided on the wiring layer IL1. The contact plug CP1 penetrates the interlayer insulating film 13, and electrically connects the wire D2 of the wiring layer IL1 and the word lines WL2. In this example, the plurality of word lines WL1 are connected to the upper surface of the contact plug CP1 at a same device level, for example, on the upper surface of the interlayer insulating film 13.

In the memory cell region MCR, for example, an insulating film 15 is further provided on the interlayer insulating film 13. The source line SL is provided on the insulating film 15. The source line SL includes, for example, the conductive layer 20 and the semiconductor layer 30. The selection gate SGS is provided on the source line SL with an interlayer insulating film 17 interposed therebetween. The selection gate SGS includes, for example, polysilicon.

As shown in FIG. 2, the insulating film 15, the source line SL, the interlayer insulating film 17 and the selection gate SGS do not extend to the lead-out region HUR, but the end portions thereof are located at the boundary between the memory cell region MCR and the lead-out region HUR, for example. Therefore, a step is provided between the selection gate SGS and the upper surface of the interlayer insulating film 13.

The word lines WL are stacked on the selection gate SGS with the interlayer insulating film 21 or 23 interposed therebetween. The word lines WL1 cover steps located at the boundary between the memory cell region MCR and the lead-out region HUR, and each of them is in contact with the contact plug CP1 on the upper surface of the interlayer insulating film 13. The word lines WL1 are electrically insulated from each other by the interlayer insulating film 21. Furthermore, steps formed at the end portion of the uppermost layer of the word lines WL1 are planarized, for example, by embedding an insulating film 25. The interlayer insulating films 21 and 23 and the insulating film 25 are, for example, silicon oxide films.

The word lines WL2 are stacked on the planarized surface of the interlayer insulating film 21 and the insulating film 25, and an interlayer insulating film 23 is interposed between the adjacent word lines WL2. In the lead-out region HUR, respective end portions of the word lines WL2 are provided in a staircase pattern with the upper surfaces exposed. Then, the word lines WL2 are connected to the gate wiring GL via the contact plug CP2 connected to each end portion thereof.

As shown in FIG. 2, the contact plug CP1 connecting the word lines WL1 and the wire D2 is located below end portions of the word lines WL2 provided in a staircase pattern. As a result, the area of the lead-out region HUR can be reduced. In addition, the wiring resistance between the word lines WL and the circuit DC can be reduced, and the response speed of the word lines WL can be improved.

Next, with reference to FIGS. 3A to 5B, a method of manufacturing the storage device 2 according to the embodiment will be described. FIGS. 3A to 5B are schematic cross-sectional views showing the manufacturing process of the storage device 2.

Figure 3A:
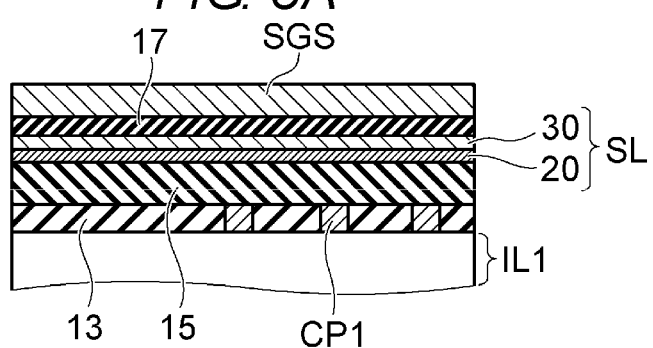
FIGS. 3A, 3B, and 3C are schematic cross-sectional views showing a manufacturing process of the storage device according to the embodiment.

As shown in FIG. 3A, the interlayer insulating film 13, the insulating film 15, the source line SL, the interlayer insulating film 17 and the selection gate SGS are stacked on the wiring layer IL1. The interlayer insulating films 13 and 17 and the insulating film 15 are formed by using, for example, plasma CVD (Chemical Vapor Deposition). The source line SL and the selection gate SGS are formed by using, for example, CVD. The contact plug CP1 connected to a wire D2 is embedded in the interlayer insulating film 13. The contact plug CP1 includes, for example, tungsten (W).

Figure 3B:
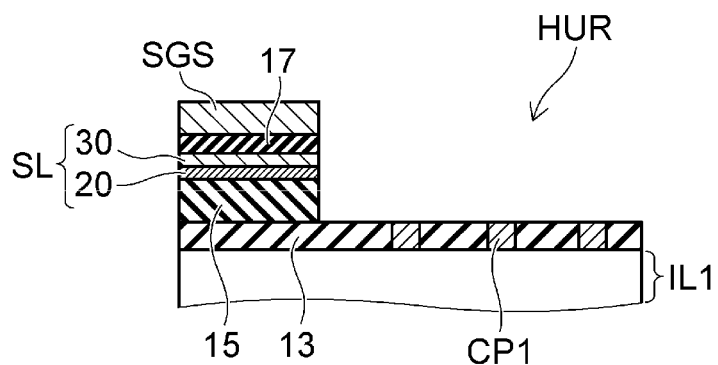

As shown in FIG. 3B, the insulating film 15, the source line SL, the interlayer insulating film 17 and the selection gate SGS are selectively removed in the lead-out region HUR to expose the contact plug CP1 on the upper surface of the interlayer insulating film 13. The selection gate SGS, the interlayer insulating film 17, the source line SL and the insulating film 15 are sequentially removed, for example, by dry etching. The insulating film 15 is, for example, a silicon nitride film, and is selectively removed from the interlayer insulating film 13 which is a silicon oxide film.

Figure 3C:
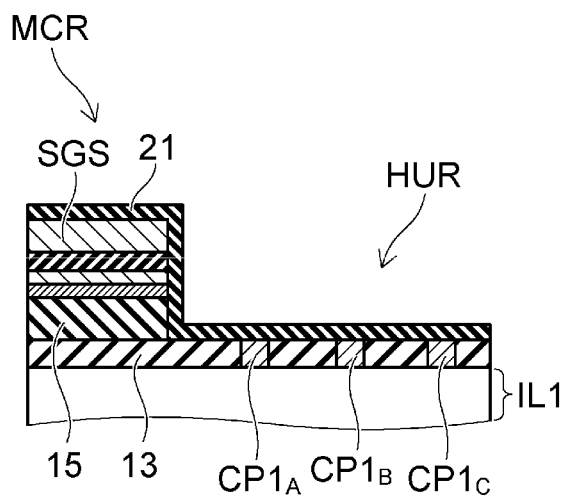

As shown in FIG. 3C, an interlayer insulating film 21 is formed to cover the selection gate SGS, the steps at the boundary between the memory cell region MCR and the lead-out region, and the lead-out region HUR. The interlayer insulating film 21 is, for example, a silicon oxide film formed by plasma CVD.

Figure 4A:
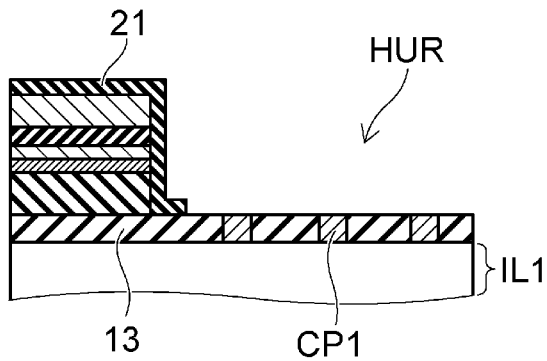
FIGS. 4A, 4B, and 4C are schematic cross-sectional views showing a manufacturing process following FIGS. 3A to 3C.

As shown in FIG. 4A, the interlayer insulating film 21 is partially removed in the lead-out region HUR to expose the contact plug CP1.

Figure 4B:
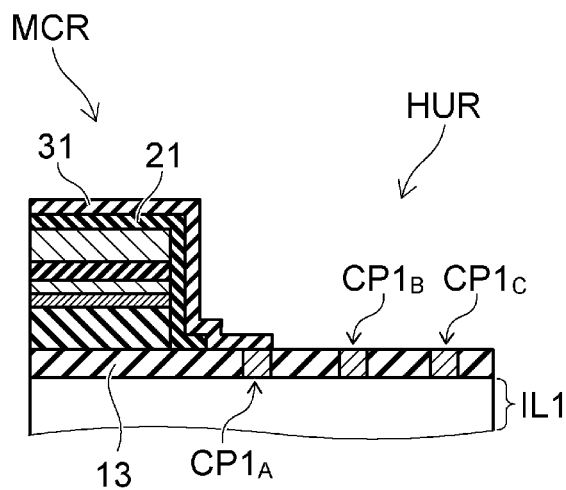

As shown in FIG. 4B, a sacrificial film 31 covering the interlayer insulating film 21 is formed. The sacrificial film 31 is, for example, a silicon nitride film formed by plasma CVD. The sacrificial film 31 is selectively removed so as to expose the contact plugs $CP1_B$ and $CP1_C$, leaving a portion covering the interlayer insulating film 21 and a portion in contact with the contact plug $CP1_A$. The contact plugs $CP1_A$, $CP1_B$ and $CP1_C$ are disposed in this order at positions of increasing distant from the memory cell region MCR.

Figure 4C:
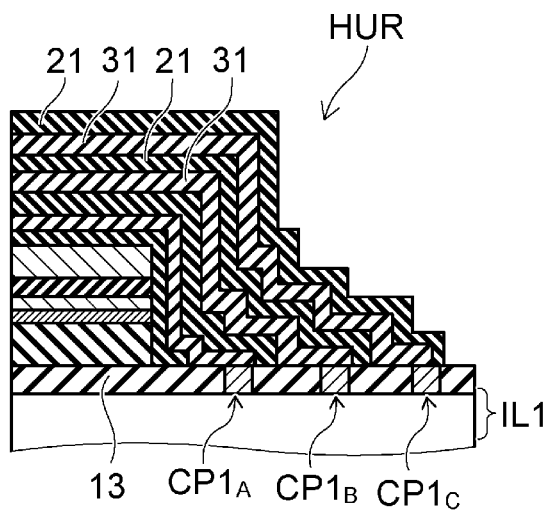

As shown in FIG. 4C, the interlayer insulating film 21 and the sacrificial film 31 are alternately stacked. For example, sacrificial films 31 in contact with the contact plugs $CP1_B$ and $CP1_C$, respectively, are stacked by repeating the procedure of FIGS. 3C to 4B.

Figure 5A:
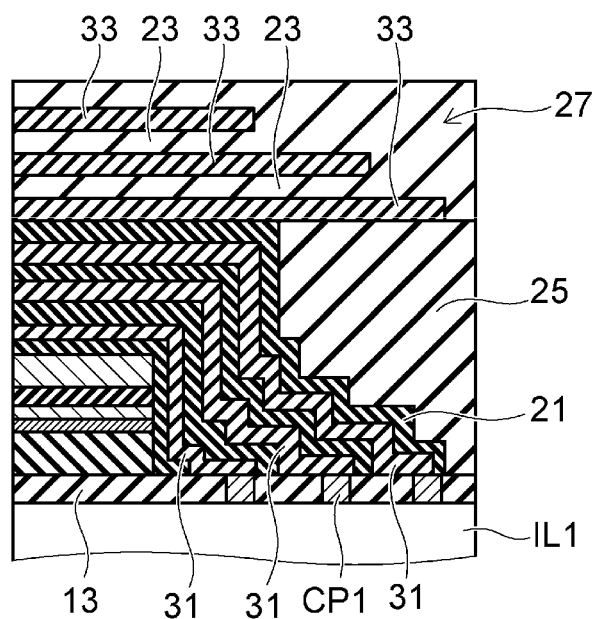
FIGS. 5A and 5B are schematic cross-sectional views showing a manufacturing process following FIGS. 4A to 4C.

As shown in FIG. 5A, the insulating film 25 covering the steps of the uppermost layer of the interlayer insulating film 21 is formed, then planarized by, for example, CMP (Chemical Mechanical Polishing). The uppermost layer of the interlayer insulating film 21 and the surface of the insulating film 25 are planarized. The insulating film 25 is, for example, a silicon oxide film made by CVD.

Subsequently, the sacrificial film 33 and the interlayer insulating film 23 are alternately stacked on the interlayer insulating film 21 and the insulating film 25. The interlayer insulating film 23 is, for example, a silicon oxide film, and the sacrificial film 33 is, for example, a silicon nitride film. Further, in the lead-out region HUR, the end portions of the sacrificial films 33 are formed in a staircase pattern, and the vacant portions are embedded with an insulating film 27. The insulating film 27 is, for example, a silicon oxide film made by CVD, and the surface thereof is planarized by CMP.

Thereafter, the semiconductor pillar 40 and the insulating film 50 are formed in the memory cell region MCR. For example, after a memory hole which penetrates the interlayer insulating films 17, 21 and 23, the sacrificial films 31 and 33 and the selection gate SGS, and is open to the source line SL, is formed the insulating film 50 and the semiconductor pillar 40 are sequentially formed therein.

Figure 5B:
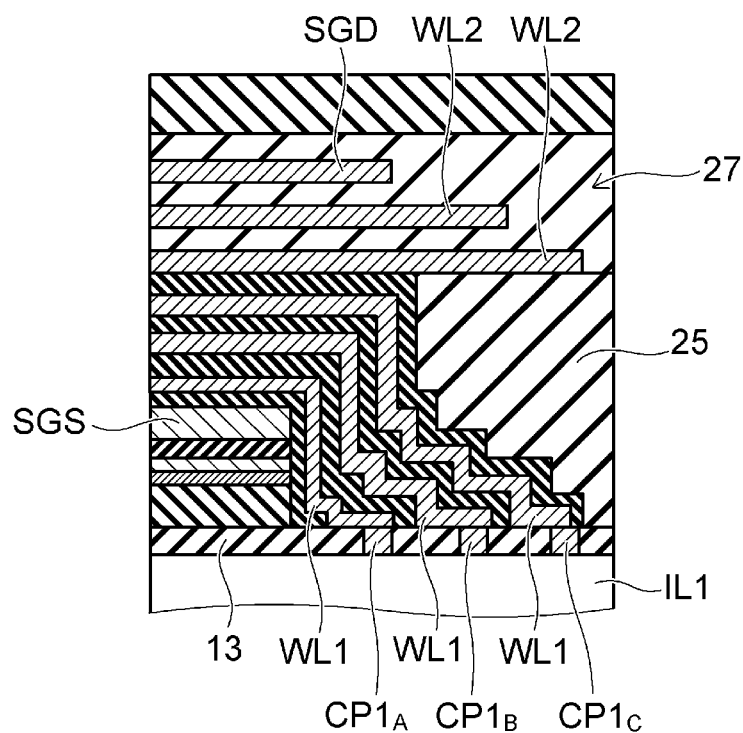

As shown in FIG. 5B, the sacrificial films 31 and 33 are removed, for example, via the slits ST (see FIG. 1B). Subsequently, a metal layer is formed in the space left by the removal of the sacrificial films 31 and 33, thereby, the word lines WL and the selection gate SGD are formed. The word lines WL1 are formed in the space from which the sacrificial film 31 is removed, and the word lines WL2 and the selection gate SGD are formed in the space from which the sacrificial film 33 is removed.

Next, in the lead-out region HUR, the contact plug CP2 connected to the end portion of each of the word lines WL2 and the selection gate SGD is formed, and then, the wiring layer IL2 is formed to complete the storage device 2.

Figure 6:
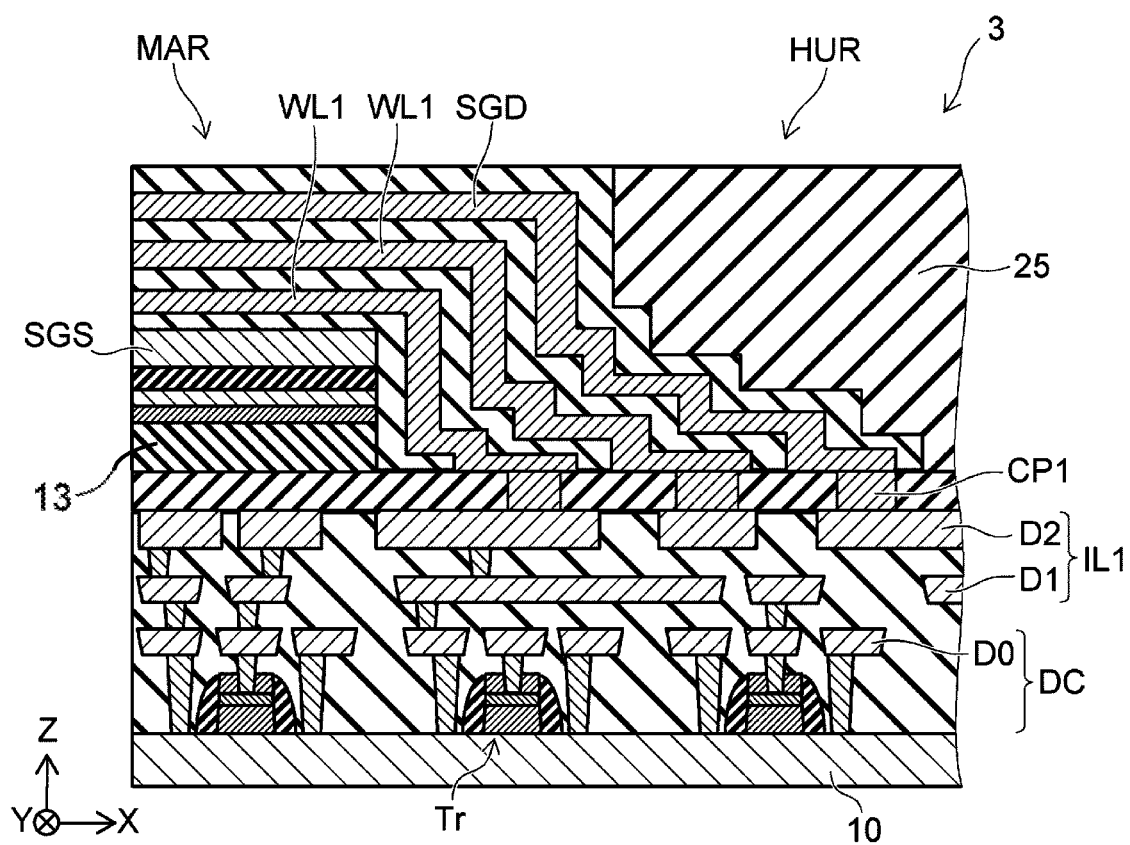
FIG. 6 is a schematic cross-sectional view showing a storage device according to a variation of the embodiment.

FIG. 6 is a schematic cross-sectional view showing a storage device 3 according to a variation of the embodiment. In the storage device 3, no word line WL2 is provided, a plurality of word lines WL1 are stacked on the selection gate SGS, and the selection gate SGD is stacked on the word lines WL1. In this example, both the word lines WL1 and the selection gate SGD are connected to the wire D2 of the wiring layer IL1 via the contact plug CP1 provided in the interlayer insulating film 13. It is noted that, in FIG. 6, for the sake of simplicity, the number of stacked word lines WL1 is reduced.

Generally, when the end portions of the word lines WL2 are formed in a staircase pattern and a contact plug CP2 is connected to each end portion thereof, the required aspect ratio of the contact plugs CP2 increases as the number of stacked layers increases. As the aspect ratio increases, the difficulty in forming and aligning the contact holes used in forming the contact plugs CP2 is increased. On the other hand, in the storage device 3, the end portion of the sacrificial film 31 replaced with a word line WL1 can be aligned with the contacts plug CP1 each disposed at a same level. Therefore, the alignment difficulty can be reduced, and the area of the lead-out region HUR can also be reduced as compared with the case where a contact plug CP2 must be formed for each staircase portion. In addition, the wiring resistance between the word lines WL1 and the circuit DC can be greatly reduced. Furthermore, the process of forming the end portions of the sacrificial films 33 in a staircase pattern may be omitted, thus, the overall manufacturing process can be simplified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
   a first wiring layer including a plurality of first wires therein;
   a second wiring layer spaced from the first wiring layer in a first direction and including a plurality of second wires therein;
   a plurality of first electrode layers stacked in the first direction between the first wiring layer and the second wiring layer;
   a plurality of second electrode layers stacked in the first direction between the plurality of first electrode layers and the second wiring layer; and
   a semiconductor pillar penetrating the first plurality of electrode layers and the second plurality of electrode layers in the first direction, wherein
   each first electrode layer is connected to one first wire in the first wiring layer,
   each second electrode layer is connected to one second wire in the second wiring layer,
   the plurality of first electrode layers have end portions formed in a staircase pattern facing the first wiring layer, and
   the plurality of second electrode layers have end portions formed in a staircase pattern facing the second wiring layer.

2. The storage device according to claim 1, further comprising:
   a plurality of first connection conductors connecting the first electrode layers and the first wires.

3. The storage device according to claim 2, further comprising:
   a plurality of second connection conductors connecting the second electrode layers and the second wires.

4. The storage device according to claim 1, further comprising:
   a circuit electrically connected to the semiconductor pillar and the plurality of electrode layers, wherein
   the first wiring layer is between the circuit and the plurality of electrode layers in the first direction.

5. A storage device, comprising:
   a first wiring layer;
   a second wiring layer spaced from the first wiring layer in a first direction;
   a plurality of electrode layers stacked in the first direction between the first wiring layer and the second wiring layer;
   a semiconductor pillar penetrating the plurality of electrode layers in the first direction; and
   a circuit electrically connected to the semiconductor pillar and the plurality of electrode layers, wherein
   the first wiring layer is between the circuit and the plurality of electrode layers in the first direction, and
   the plurality of electrode layers includes:
   a plurality of first electrode layers, and
   a plurality of second electrode layers,
   the first electrode layers are between the first wiring layer and the second electrode layers in the first direction,
   the second electrode layers are between the second wiring layer and the first electrode layers in the first direction,
   the plurality of first electrode layers have end portions forming a staircase pattern facing the first wiring layer, and
   the storage device further comprises contact plugs extending in the first direction between the end portions of the plurality of first electrode layers and the first wiring layer.

6. The storage device according to claim 5, wherein
   the plurality of second electrode layers have end portions forming a staircase pattern facing the second wiring layer, and
   the storage device further comprises:
   contact plugs extending in the first direction between the end portions of the plurality of second electrode layers and the second wiring layer.

7. The storage device according to claim 2, wherein at least one of the first connection conductors includes a tapered portion tapered toward the plurality of first wires.

8. The storage device according to claim 3, wherein at least one of the second connection conductors includes a tapered portion tapered toward the second electrode layers.

9. The storage device according to claim 1, further comprising:
   a source line between the first wiring layer and the first electrode layers; and
   a bit line between the second wiring layer and the second electrode layers, wherein
   the source line is connected to one end of the semiconductor pillar, and
   the bit line is connected to the other end of the semiconductor pillar.

10. The storage device according to claim 5, further comprising:
    a plurality of first connection conductors connecting the first electrode layers and the first wires.

11. The storage device according to claim 10, further comprising:
    a plurality of second connection conductors connecting the second electrode layers and the second wires.

12. The storage device according to claim 11, wherein at least one of the second connection conductors includes a tapered portion tapered toward the second electrode layers.

13. The storage device according to claim 10, wherein at least one of the first connection conductors includes a tapered portion tapered toward the first wires.

14. The storage device according to claim 5, further comprising:
    a source line between the first wiring layer and the first electrode layers; and
    a bit line between the second wiring layer and the second electrode layers, wherein
    the source line is connected to one end of the semiconductor pillar, and
    the bit line is connected to the other end of the semiconductor pillar.

* * * * *